(12) United States Patent
Psiaki et al.

(10) Patent No.: US 10,846,205 B2
(45) Date of Patent: Nov. 24, 2020

(54) ENHANCEMENTS TO SUPPORT TESTING OF AUGMENTED REALITY (AR) APPLICATIONS

(71) Applicant: GOOGLE LLC, Mountain View, CA (US)

(72) Inventors: Timothy Psiaki, Duvall, WA (US); Jeffrey McGlynn, Seattle, WA (US); Thomas Salter, Seattle, WA (US); Jessica Liu, Mountain View, CA (US)

(73) Assignee: GOOGLE LLC, Mountain View, CA (US)

( * ) Notice: Subject to any disclaimer, the term of this patent is extended or adjusted under 35 U.S.C. 154(b) by 0 days.

(21) Appl. No.: 16/226,157

(22) Filed: Dec. 19, 2018

(65) Prior Publication Data
US 2019/0196940 A1    Jun. 27, 2019

Related U.S. Application Data

(60) Provisional application No. 62/608,782, filed on Dec. 21, 2017.

(51) Int. Cl.
| | | |
|---|---|---|
| G06F 9/44 | (2018.01) | |
| G06F 11/36 | (2006.01) | |
| H04W 4/02 | (2018.01) | |
| G06T 19/00 | (2011.01) | |
| G06F 9/455 | (2018.01) | |

(Continued)

(52) U.S. Cl.
CPC .......... *G06F 11/3664* (2013.01); *G06F 3/011* (2013.01); *G06F 9/455* (2013.01); *G06F 11/3672* (2013.01); *G06F 11/3696* (2013.01); *G06F 30/20* (2020.01); *G06T 19/006* (2013.01); *H04W 4/027* (2013.01)

(58) Field of Classification Search
CPC ............ G06F 11/3664; G06F 11/3672; G06F 11/3696; G06F 9/455; G06F 30/20; G06T 19/006; H04W 4/027
See application file for complete search history.

(56) References Cited

U.S. PATENT DOCUMENTS

| | | | |
|---|---|---|---|
| 9,880,553 B1* | 1/2018 | Hoffmann | ............ G05D 1/0038 |
| 2018/0267496 A1* | 9/2018 | Wang | ................... G05B 19/056 |
| 2018/0336735 A1* | 11/2018 | Haines | .................... G06F 16/48 |

OTHER PUBLICATIONS

Anderson C. M. Tavares et al., Augmented Reality in Collaborative Virtual Environment for Discrete Event Systems Modeling and Simulation, IEEE, 2012, retrieved online on Jul. 15, 2020, pp. 155-164. Retrieved from the Internet: <URL: https://ieeexplore.ieee.org/stamp/stamp.jsp?tp=&arnumber=6297572>. (Year: 2012).*

(Continued)

*Primary Examiner* — Hanh Thi-Minh Bui
(74) *Attorney, Agent, or Firm* — Brake Hughes Bellermann LLP

(57) ABSTRACT

An example method of testing Augmented Reality (AR) applications is described. In an example implementation, the method includes initiating an AR application that is targeted for testing. The example method further includes controlling a physical model to simulate movement of a simulated device in a simulated real-world space. The simulated movement of the physical model generates data for testing the AR application. In some implementations, the method may further include initiating the AR application to run on a device simulator and using a virtual environment.

22 Claims, 4 Drawing Sheets

(51) Int. Cl.
    *G06F 3/01*         (2006.01)
    *G06F 30/20*       (2020.01)

(56) References Cited

OTHER PUBLICATIONS

"Using the HoloLens Emulator", MicroSoft Docs (https://docs.microsoft.com/en-us/windows/mixed-reality/using-the-hololens-emulator), Oct. 17, 2018, 1 page.
International Search Report and Written Opinion for International Application No. PCT/US2018/066977, dated Mar. 29, 2019, 12 pages.
Protalinski, "Microsoft launches HoloLens emulator so developers can test holographic apps, no headset required", Mar. 30, 2016, retrieved from the internet on Mar. 21, 2019, XP055572804.

\* cited by examiner

ENHANCEMENTS TO SUPPORT TESTING OF AUGMENTED REALITY (AR) APPLICATIONS

CROSS-REFERENCE TO RELATED APPLICATIONS

This application claims priority to U.S. Patent Application No. 62/608,782, filed on Dec. 21, 2017, entitled "EMULATOR ENHANCEMENTS TO SUPPORT AUGMENTED REALITY (AR) APPLICATIONS," the disclosure of which is incorporated by reference herein in its entirety.

BACKGROUND

Augmented Reality (AR) experiences are highly dependent on the context in which they are used. Therefore, development of AR applications requires access to test environments that are representative of environments a developer is targeting. This may require developers to physically move around in the test environments which not only slows down the development process but also limits the scope of testing.

SUMMARY

An example method, apparatus, and compute-readable storage medium for testing Augmented Reality (AR) applications are described. In an example implementation, an example method includes initiating an AR application that is targeted for testing. The example method further includes controlling a physical model to simulate movement of a simulated device in a simulated real-world space. The simulated movement of the physical model generates data for testing the AR application. In some implementations, the method may further include initiating the AR application to run on a device simulator and using a virtual environment.

DETAILED DESCRIPTION

Augmented Reality (AR) systems do not provide support for testing AR applications. The testing of an AR application may be defined as a process to evaluate the functionality of the AR application to find out whether the AR application meets the specified requirements and/or to ensure the AR application is free from defects (e.g., evaluate functionality, robustness, quality, etc. of the AR application). A proposed solution to this technical problem includes using a device simulator running on the AR system to test AR applications. In an example implementation, the device simulator may be configured to run on a computing device configured with the AR system. A physical model that runs on the device simulator may be created and the movement of the physical model controlled by a user. The physical model when driven by the user generates data that is similar to data generated by real movement of a real device. The generated data is forwarded to a tracking framework of the AR system which may be displayed to the user so that the user can verify the performance of the AR application. The technical advantages of using a simulated device described above to test AR applications include the flexibility in testing AR applications from the comfort of one's desk, in various virtual environments, and different device configurations. This achieves efficient use of time and resources and results in cost savings and improved quality of AR applications.

Figure 1:
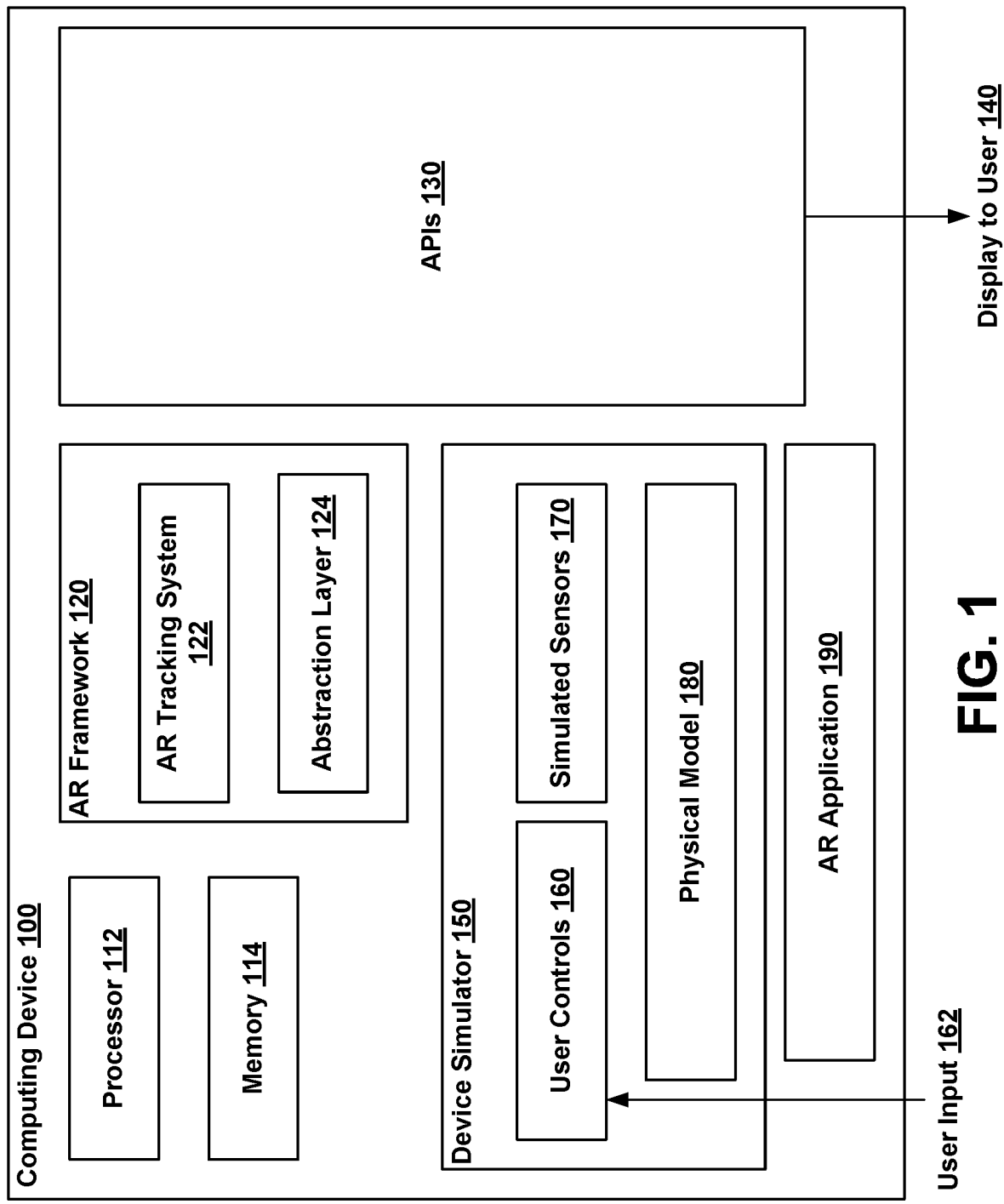
FIG. 1 illustrates a block diagram of an example of a computing device with a device simulator to develop/test AR applications, in accordance with implementations described herein.

FIG. 1 illustrates a block diagram of a computing device 100 which includes a device simulator 150, according to at least one example implementation. In some example implementations, the device simulator 150 can be used for testing AR applications, for example, AR application 190, as described herein.

The computing device 100 includes a processor 112, a memory 114, an AR framework 120, application programming interfaces (APIs) 130, and/or the device simulator 150. The device simulator 150 receives input from, for example, from a user, via user input 162 and the computing device 100 outputs graphics to a display via, for example, display to user 140.

The AR framework 120 includes an AR tracking system 122 to support AR experiences by integrating virtual content with the real world as seen through a device's camera using the APIs 130. For example, in some implementations, the AR tracking system 122 may support AR experiences by motion tracking, environmental understanding, light estimation, etc. The motion tracking may allow a device to understand and track the device's position relative to the word. The environmental understanding may allow a device to detect the size and location of all types of surfaces, e.g., horizontal, vertical, and angled surfaces, etc. The light estimation may allow a device to estimate the environment's lighting conditions.

The AR tracking system 122 tracks the position of a device (e.g., a mobile device) as the device moves in the real world (space) and builds its own understanding of the real world. The AR tracking system 122 uses sensors (e.g., camera, accelerometer, gyroscope, inertial measurement unit (IMU), global positioning system (GPS), etc.) in the device to identify interesting points (e.g., key points, features, etc.) and tracks how such points move over time. The AR tracking system 122 may determine position, orientation, etc. of the device as the device moves through the real world based on a combination of the movement of these points and readings from the device's sensors.

In addition to identifying the interesting points, the AR tracking system 122 may detect flat surfaces (e.g., table, floor, etc.) and may also estimate the average lighting in the surrounding areas (or environment). These capabilities of the AR tracking system 122 may combine to enable the AR framework 122 to build its own understanding of the real world around it. Further, the understanding of the real world lets a user place objects, annotations, or other information to seamlessly integrate with the real world. For example, a user may place objects, e.g., a napping kitten on the corner of a coffee table, annotate a painting with biographical information about the artist, etc. The motion tracking functionality of the AR tracking system 122 allows the user to move around and view these objects from any angle. For instance, if the user turns around and leaves the room, and comes back later, the objects (e.g., napping kitten on the corner of the coffee table or the annotations on the painting) will be where the user placed them.

The AR framework 120 may include an abstraction layer 124 (for example, a hardware abstraction layer. The abstraction layer 124 represents an interface between the operating system (OS, not shown) of the computing device 100 and the device simulator 150. That is, the abstraction layer 124 provides the interface which enables the OS of the computing device 100 to be agnostic about lower-level driver implementations. In an example implementation, the abstraction layer 124 may support functionality to be implemented in the device simulator 150 without affecting or modifying the higher level system (e.g., AR framework 120 and/or AR tracking system 122). That is, the abstraction layer 124 allows APIs 130 provided by the computing device 110 (or the OS of the computing device 110) to assume that the OS is interacting with a real device (and not a simulated device such as device simulator 150). The APIs 124 provided by the OS of the computing device 110 may include Graphics APIs, Sensor APIs, Camera APIs, etc.

The device simulator 150 simulates a mobile device (e.g., a mobile phone, a tablet, etc.) on the computing device 100 (e.g., a desktop computer). In an example implementation, the device simulator 150 may be an application running on the computing device 100. The device simulator 150 can provide most of the capabilities of a real mobile device and/or may have pre-defined/pre-configured configurations for different devices or device types. In some implementations, for example, a user may also configure the device simulator 150 to simulate, for example, a location of the device, network speeds, rotation, sensors (e.g., camera, accelerometer, gyroscope, IMU, GPS, etc.), etc.

In some implementations, each instance of the device simulator 150 may use a virtual device configuration to configure size, form factor, OS version, and other desired hardware characteristics, and may function as an independent device with its own private storage. For example, the device simulator 150 may store user data, SD card data, and/or cache associated with a virtual device in a directory specific to that virtual device. When a user launches the device simulator 150, the device simulator 150 loads the user data, SD card data, and/or the cache from the associated virtual device directory. The device simulator 150, in some implementations, may further include, for example, user controls 160, simulated sensors 170, and/or a physical model 180. Some or all of the components (e.g., 150, 160, 170, and 180) of the device simulator 150, together or in combinations, may be stored in the memory 112 and/or implemented by machine-readable instructions executed by the processor 112.

The physical model 180, in some implementations, may be used to simulate the movement of a real device. That is, the physical model may be an application running on the device simulator 150 that simulates inertial movement of an object through an environment. For example, a user, using the user input 162 and via the user controls 160 may control the movement (e.g., behavior) of the physical model 180 in space. The user may control the behavior of the physical model 180 by sending instructions via the user input 162 to the user controls 160. In an example implementation, the user controls 160 may be controlled via the user input 162 which may include, for example, WASD keys, mouse controls, arrow keys, joysticks, trackpads, game controllers, etc. When a user engages the user controls 160 using, for example, using a W key of a key board to move the physical model 180 forward, the physical model 180 moves forward in a way that simulates movement of a real device in space. For example, the movement of the physical model 180 may represent a real device moving inertially (e.g., with certain acceleration and velocity, no jumps, etc.) in space. In other words, the physical model 180 may simulate movement of a real device moving in space in such a way that the position of the physical model 180 is continuous through a second derivative (e.g., acceleration) and the rotation of the physical model 180 is continuous through a first derivative (e.g., angular velocity).

As the AR tracking system 122 assumes that the device being tracked (e.g., device simulator 150) is a physical device moving through the real world, the movement of the physical model 180 is modeled in order to simulate realistic physical movement. A simulation of this physical movement may be managed and exposed to other components via the physical model 180. In some implementations, the physical model 180 may smoothly interpolate physical parameters describing the current state of the system and expose the ways of controlling the system to other components to allow these components to drive movement of the physical model 180 (e.g., instruct the physical model 180 to move smoothly to a particular position and rotation) such that position, velocity, acceleration, rotation, angular velocity, etc. of the physical model 180 are all continuous.

For example, if the user via user controls 160 instructs the physical model 180 to move at a velocity of 1 meter/second, a real device cannot suddenly move at a velocity of 1 m/s (starting from a velocity of 0 m/s), but instead takes some time to move at a velocity of 1 m/s. In some implementations, the physical model 180 may be considered as a master controller as the physical model 180 can compute its own location, velocity, acceleration, rotational velocity, etc. The physical model 180 computes this information in such a way that they are realistic in nature (e.g., smooth/continuous, no jumps, etc.). In some implementations, the physical model 180 may be considered to be acting as a mediator between the user controls 160 and other components (e.g., simulated sensors 170) of the device simulator 150. For example, upon receiving instructions (e.g., to simulate movement) via the user input 162, the physical model 180 may generate its own data and/or interact with the simulated sensors 170 to correct the generated data (e.g., feedback mechanism) to ensure the data generated by the physical model 180 represents real movement of a real device.

The simulated sensors 170 may include any type of simulated sensors, for example, a virtual camera, an accelerometer, IMU, etc. In some implementations, for example, the feed from a virtual camera may support camera APIs that are built in a way such that the view matrix (e.g., position, orientation, etc.) of the camera feed is set based on the real-time position reported by the physical model 180. This may ensure a highly realistic scene of sufficient complexity is rendered to provide features to the AR tracking system 122. Additionally, in some implementations, the simulated sensors 170 report simulated IMU data through the APIs 130 (e.g., IMU API) 118 at a high frequency and based on the real-time state of the physical model 180. The user controls 160 may drive the physical model 180 in real-time such that a user can easily and comfortably move the camera through the world.

In some implementations, in order to calculate simulated IMU readings (e.g., accelerometer, gyroscope measurements), acceleration and angular velocity in a device's frame of reference have to be instantaneously computed. In one aspect, a polynomial interpolation (e.g., in 3D space for position; in 4D space for rotation) with a high enough degree may be implemented so that the acceleration and angular velocity are continuous, and interpolation to the user-control set target position and rotation over a fixed time period may be achieved. This way all derivatives are always available for IMU calculations.

In addition, for tracking to work properly, a sensor (e.g., a virtual camera) cannot be rotated to a point. Instead, the virtual camera may be placed at an offset from the center of rotation. For example, the location of the virtual camera may have a minor offset from the location of the virtual device that the user can control and rotate using a user interface of the device simulator 150. That is, for the tracking mechanism 122 to work properly, the physical model 180 and the simulated sensors 170 may be computed or calculated in accordance with the device requirements for the AR framework 120. In an example implementation, this may require particular offsets between virtual cameras and simulated sensor positions. In another example, the physical model 180 may simulate the layout of different sensors on a device, e.g., position, rotation, etc. of the IMU relative to the device.

In some implementations, a user may engage the user controls 160 to drive the physical model 180 forward to test an AR application using the device simulator 150. As the physical model 180 moves forward, the physical model 180 may generate data related to, for example, position, velocity, acceleration, rotation, etc. of the physical model 180. The data generated by the physical model 180 may be shared with the simulated sensors 170. The simulated sensors 170 report the generated data via the abstraction layer 124 to the AR tracking system 122. In other words, a user may control the physical model 180 using user controls 160 (via user input 162). Upon receiving input from the user controls 160, the physical model 180 may generate data (e.g., position, velocity, acceleration, rotation, etc.) for the physical model 180. The data generated by the physical model 180 is shared with the simulated sensors 170 via the abstraction layer 124 to be forwarded to the AR tracking system 122. This allows the AR tacking system 122 to assume that the data (e.g., position, velocity, acceleration, rotation, etc.) is being received from a real device. This allows a user to conveniently/efficiently test AR applications using the device simulator 150 from the comfort of their own desks.

In some implementations, for example, the device simulator 150 may be used to introduce errors/imperfections in the data generated by the physical model 180 to simulate/reproduce error/failure scenarios, for example, sensor noise and error, camera limitations (e.g., lens distortions, motion blur, reduced contrast from conditions like low-light levels, etc.), and miscalibration and misalignment between camera and sensor data, etc., that would be encountered on a real device when running an AR application. This will assist in simulating AR tracking system failure conditions, e.g., loss of tracking (for instance, when walking down a dark hallway), drift between tracked and physical position (objects appear to slide), etc.

The example processor 112 of FIG. 1 may be in the form of a microcontroller, a central processing unit (CPU), an ASIC, a digital signal processor (DSP), an FPGA, a graphics processing unit (GPU), etc. programmed or configured to execute machine-readable instructions stored in the memory 114. The instructions, when executed, may cause the processor 112 and/or the components described above, among other things, control the device simulator 150 to simulate a real device and the physical model 180 to simulate realistic movement of a mobile device in the real world. In some examples, more than one processor 112 or more than one memory 114 may be included in the computing device 100.

Figure 2:
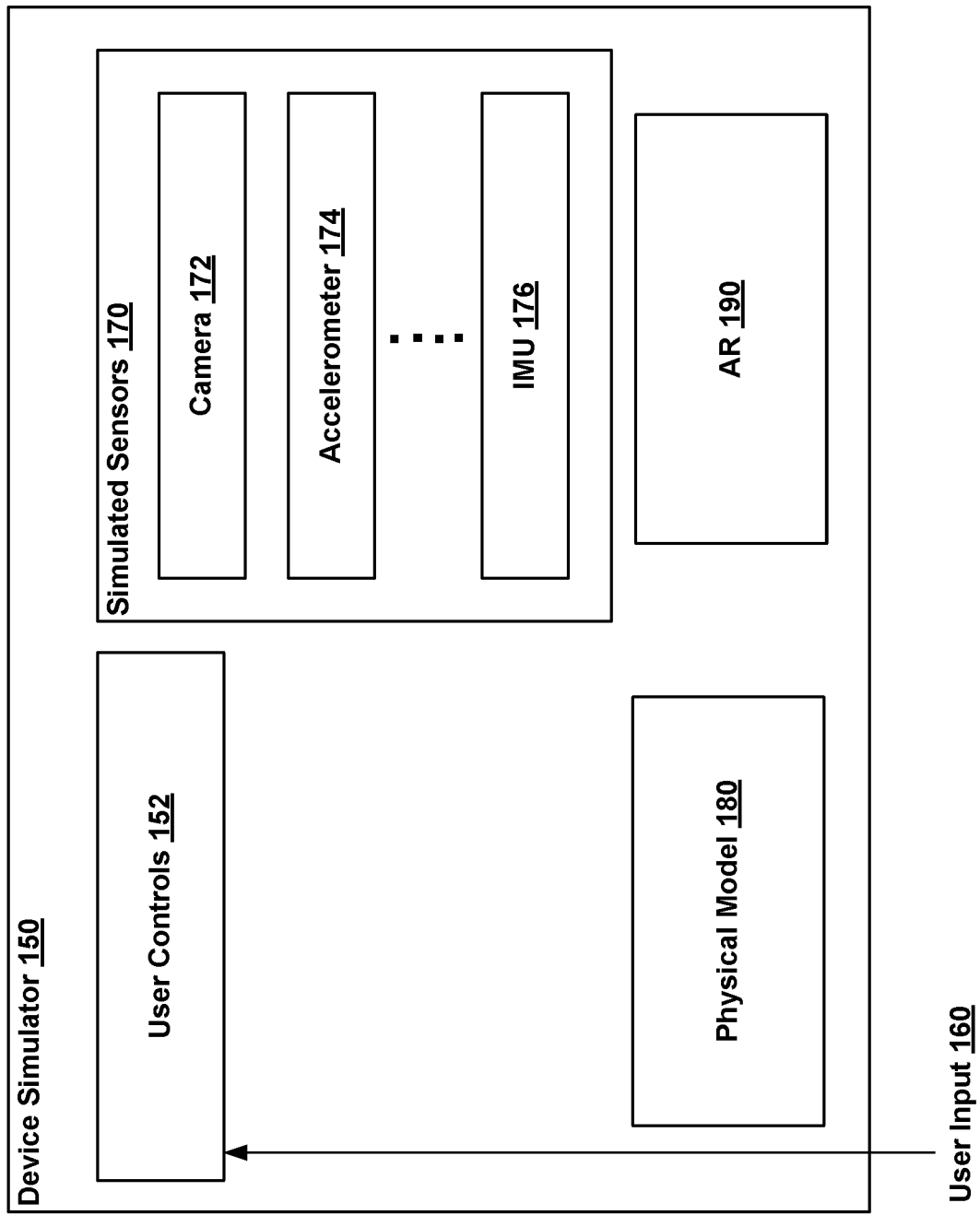
FIG. 2 illustrates a block diagram of an example device simulator to develop/test AR applications, in accordance with implementations described herein.

FIG. 2 illustrates a block diagram of the device simulator 150, according to at least one example implementation. As shown in FIG. 2, the simulated sensors 170 may include various types of sensors, for example, camera 172, accelerometer 174, IMU 176, etc. As described above, the simulated sensors provide support to the physical model 180 so that the physical mode 180 can correct the data generated by it. In some example implementations, the physical model 180 can use the data from the simulated sensors 170 to correct drifting.

Figure 3:
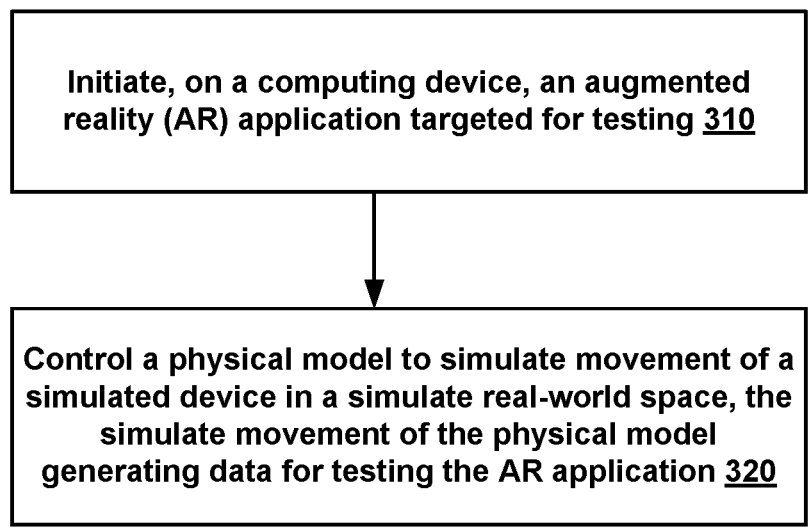
FIG. 3 is a flowchart of a method of testing AR applications using a device simulator, in accordance with implementations described herein.

FIG. 3 is a flowchart 300 of a method of testing AR applications using a device simulator, in accordance with example implementations described herein.

At block 310, a user initiates an AR application targeted for testing on a computing device. For example, a user may initiate (e.g., launch, start, etc.) AR application 190 on the computing device 100. The user may select the AR application 190 to run on the device simulator 150 so that the user can test the AR application 190 using the device simulator 150. As described above, this allows the user to efficiently test AR applications.

During the initiation of the AR application 190, the user may select a virtual scene (e.g., virtual environment, simulated real-world scene, etc.) to be loaded which is used for testing the AR application. This supports the testing of the AR application using various virtual indoor/outdoor environments depending on the testing requirements. In some implementations, the virtual scenes may be available on the computing device 100 for use by the simulated device 150. The virtual scenes provide the capability to test AR application 190 in various virtual environments to improve the quality of AR applications and/or user experience.

In some implementations, the user may select the configuration of the device simulator 150 based on virtual device configuration, for example, that may be available. The virtual device configuration allows the device simulator 150 to configure size, form factor, OS version, memory size, and other desired hardware characteristics, of the device simulator 150. This provides flexibility to the user to test AR applications using various device configurations.

At block 320, the user may control a physical model to simulate movement of a simulated device in a simulated real-world space. For example, the user may control the physical model 180 to simulate movement of the device simulator 150 in a simulated real-world space. In response to the user controls moving the physical model 180, the physical model 180 generates data which represents (or similar to) data generated by real movement of a real device in space. The data generated by the physical model 180 is shared with the AR tracking system 122 via the abstraction layer 124 for testing the AR application.

For example, a user may use the user controls 160 to control the physical model 180 which generates data that represents a realistic movement of a real device, for example, in a virtual environment. For example, the user initializes AR application 190 on the device simulator 150 and a loads a virtual scene of a family room. The user may use the user controls 160 to simulate movement of the physical model 180 and generate data which is forwarded the AR tracking system 122 which processes the data and displays to the user via API 130. The user views the performance of the AR application 190 via the camera API using a display (e.g., display to user 140) to determine whether the AR application 190 is working or performing as intended.

The above defined capability allows the user to test AR applications in any virtual environments (depending on the availability of the virtual environment) from the comfort of his/her desk and with any device configuration by configuring the device simulator 150 with the configuration the user wants. This functionality not only provides the capabilities to test AR applications but to efficiently test them.

Figure 4:
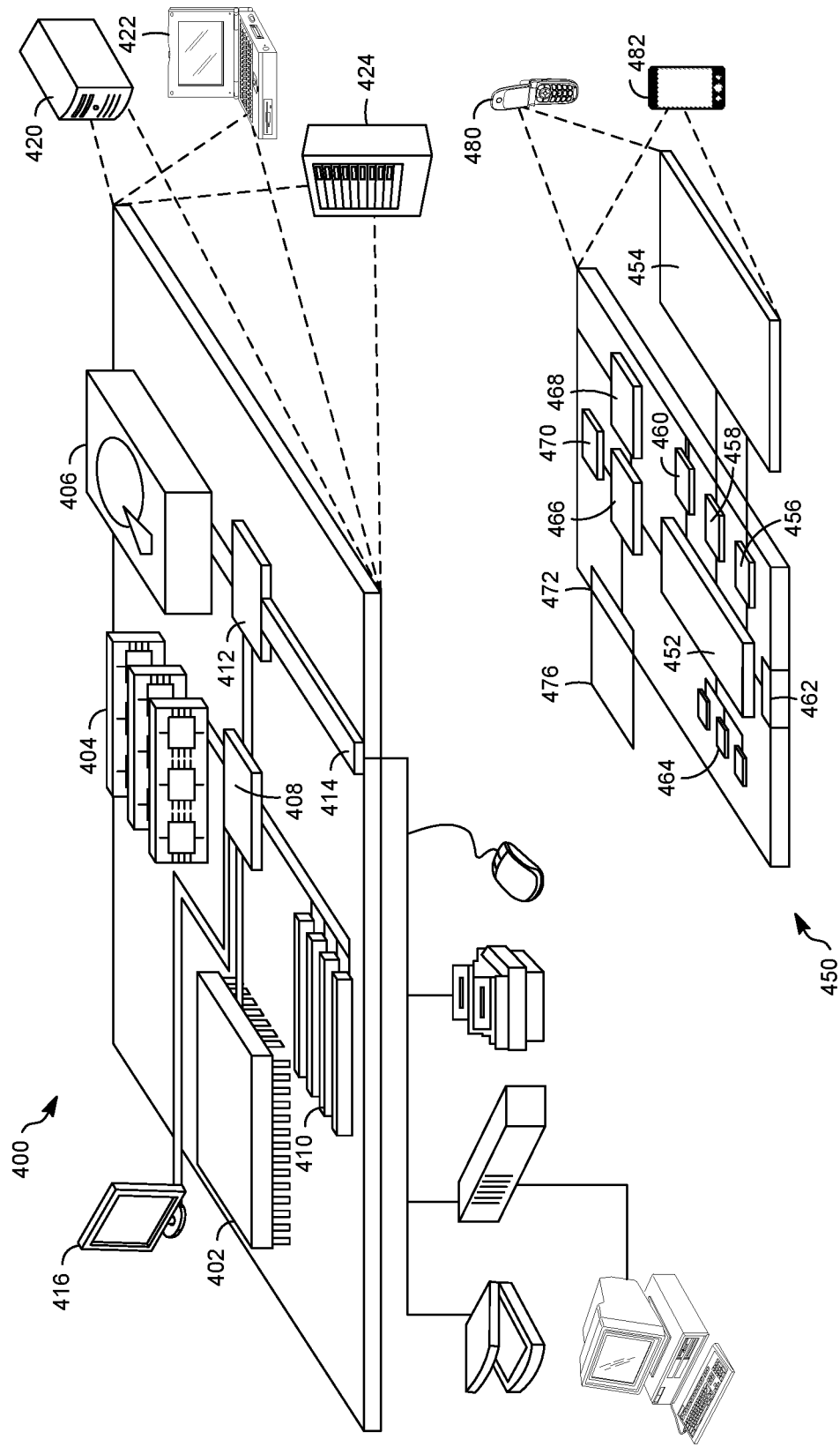
FIG. 4 shows an example of a computing device and a mobile computing device that can be used to implement the techniques described herein.

FIG. 4 shows an example of a computing device 400 and a mobile computing device 450, which may be used with the techniques described here.

For example, computing device 400 may be a device on which the emulator 140 is configured to run and/or mobile computer device 450 may be a mobile device on which applications are run. Computing device 400 is intended to represent various forms of digital computers, such as laptops, desktops, tablets, workstations, personal digital assistants, televisions, servers, blade servers, mainframes, and other appropriate computing devices. Computing device 450 is intended to represent various forms of mobile devices, such as personal digital assistants, cellular telephones, smart phones, and other similar computing devices. The components shown here, their connections and relationships, and their functions, are meant to be exemplary only, and are not meant to limit implementations of the inventions described and/or claimed in this document.

Computing device 400 includes a processor 402, memory 404, a storage device 406, a high-speed interface 408 connecting to memory 404 and high-speed expansion ports 410, and a low speed interface 412 connecting to low speed bus 414 and storage device 406. The processor 402 can be a semiconductor-based processor. The memory 404 can be a semiconductor-based memory. Each of the components 402, 404, 406, 408, 410, and 412, are interconnected using various busses, and may be mounted on a common motherboard or in other manners as appropriate. The processor 402 can process instructions for execution within the computing device 400, including instructions stored in the memory 404 or on the storage device 406 to display graphical information for a GUI on an external input/output device, such as display 416 coupled to high speed interface 408. In other implementations, multiple processors and/or multiple buses may be used, as appropriate, along with multiple memories and types of memory. Also, multiple computing devices 400 may be connected, with each device providing portions of the necessary operations (e.g., as a server bank, a group of blade servers, or a multi-processor system).

The memory 404 stores information within the computing device 400. In one implementation, the memory 404 is a volatile memory unit or units. In another implementation, the memory 404 is a non-volatile memory unit or units. The memory 404 may also be another form of computer-readable medium, such as a magnetic or optical disk.

The storage device 406 is capable of providing mass storage for the computing device 400. In one implementation, the storage device 406 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 404, the storage device 406, or memory on processor 402.

The high speed controller 408 manages bandwidth-intensive operations for the computing device 400, while the low speed controller 412 manages lower bandwidth-intensive operations. Such allocation of functions is exemplary only. In one implementation, the high-speed controller 408 is coupled to memory 404, display 416 (e.g., through a graphics processor or accelerator), and to high-speed expansion ports 410, which may accept various expansion cards (not shown). In the implementation, low-speed controller 412 is coupled to storage device 406 and low-speed expansion port 414. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 400 may be implemented in a number of different forms, as shown in the figure. For example, it may be implemented as a standard server 420, or multiple times in a group of such servers. It may also be implemented as part of a rack server system 424. In addition, it may be implemented in a personal computer such as a laptop computer 422. Alternatively, components from computing device 400 may be combined with other components in a mobile device (not shown), such as device 450. Each of such devices may contain one or more of computing device 400, 450, and an entire system may be made up of multiple computing devices 400, 450 communicating with each other.

Computing device 450 includes a processor 452, memory 464, an input/output device such as a display 454, a communication interface 466, and a transceiver 468, among other components. The device 450 may also be provided with a storage device, such as a microdrive or other device, to provide additional storage. Each of the components 450, 452, 464, 454, 466, and 468, are interconnected using various buses, and several of the components may be mounted on a common motherboard or in other manners as appropriate.

The processor 452 can execute instructions within the computing device 450, including instructions stored in the memory 464. The processor may be implemented as a chipset of chips that include separate and multiple analog and digital processors. The processor may provide, for example, for coordination of the other components of the device 450, such as control of user interfaces, applications run by device 450, and wireless communication by device 450.

Processor 452 may communicate with a user through control interface 458 and display interface 456 coupled to a display 454. The display 454 may be, for example, a TFT LCD (Thin-Film-Transistor Liquid Crystal Display) or an OLED (Organic Light Emitting Diode) display, or other appropriate display technology. The display interface 456 may comprise appropriate circuitry for driving the display 454 to present graphical and other information to a user. The control interface 458 may receive commands from a user and convert them for submission to the processor 452. In addition, an external interface 462 may be provide in communication with processor 452, so as to enable near area communication of device 450 with other devices. External interface 462 may provide, for example, for wired communication in some implementations, or for wireless communication in other implementations, and multiple interfaces may also be used.

The memory 464 stores information within the computing device 450. The memory 464 can be implemented as one or more of a computer-readable medium or media, a volatile memory unit or units, or a non-volatile memory unit or units. Expansion memory 474 may also be provided and connected to device 450 through expansion interface 472, which may include, for example, a SIMM (Single In Line Memory Module) card interface. Such expansion memory 474 may provide extra storage space for device 450, or may also store applications or other information for device 450. Specifically, expansion memory 474 may include instructions to carry out or supplement the processes described above, and may include secure information also. Thus, for example, expansion memory 474 may be provide as a security module for device 450, and may be programmed with instructions that permit secure use of device 450. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 464, expansion memory 474, or memory on processor 452, that may be received, for example, over transceiver 468 or external interface 462.

Device 450 may communicate wirelessly through communication interface 466, which may include digital signal processing circuitry where necessary. Communication interface 466 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 468. In addition, short-range communication may occur, such as using a Bluetooth, Wi-Fi, or other such transceiver (not shown). In addition, GPS (Global Positioning System) receiver module 470 may provide additional navigation- and location-related wireless data to device 450, which may be used as appropriate by applications running on device 450.

Device 450 may also communicate audibly using audio codec 460, which may receive spoken information from a user and convert it to usable digital information. Audio codec 460 may likewise generate audible sound for a user, such as through a speaker, e.g., in a handset of device 450. Such sound may include sound from voice telephone calls, may include recorded sound (e.g., voice messages, music files, etc.) and may also include sound generated by applications operating on device 450.

The computing device 450 may be implemented in a number of different forms, as shown in the figure. For example, it may be implemented as a cellular telephone 480. It may also be implemented as part of a smart phone 482, personal digital assistant, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications, software modules, software components, or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network ("LAN"), a wide area network ("WAN"), and the Internet.

The computing system can include clients and servers. A client and server are generally remote from each other and typically interact through a communication network. The relationship of client and server arises by virtue of computer programs running on the respective computers and having a client-server relationship to each other.

A number of embodiments have been described. Nevertheless, it will be understood that various modifications may be made without departing from the spirit and scope of the invention.

In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

Implementations of the various techniques described herein may be implemented in digital electronic circuitry, or in computer hardware, firmware, software, or in combinations of them. Implementations may be implemented as a computer program product, i.e., a computer program tangibly embodied in an information carrier, e.g., in a machine-readable storage device (computer-readable medium), for processing by, or to control the operation of, data processing apparatus, e.g., a programmable processor, a computer, or multiple computers. Thus, a computer-readable storage medium can be configured to store instructions that when executed cause a processor (e.g., a processor at a host device, a processor at a client device) to perform a process.

A computer program, such as the computer program(s) described above, can be written in any form of programming language, including compiled or interpreted languages, and can be deployed in any form, including as a stand-alone program or as a module, component, subroutine, or other unit suitable for use in a computing environment. A computer program can be deployed to be processed on one computer or on multiple computers at one site or distributed across multiple sites and interconnected by a communication network.

Method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit).

Processors suitable for the processing of a computer program include, by way of example, both general and special purpose microprocessors, and any one or more processors of any kind of digital computer. Generally, a processor will receive instructions and data from a read-only memory or a random access memory or both. Elements of a computer may include at least one processor for executing instructions and one or more memory devices for storing instructions and data. Generally, a computer also may include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory may be supplemented by, or incorporated in special purpose logic circuitry.

To provide for interaction with a user, implementations may be implemented on a computer having a display device, e.g., a cathode ray tube (CRT), a light emitting diode (LED), or liquid crystal display (LCD) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Implementations may be implemented in a computing system that includes a back-end component, e.g., as a data server, or that includes a middleware component, e.g., an application server, or that includes a front-end component, e.g., a client computer having a graphical user interface or a Web browser through which a user can interact with an implementation, or any combination of such back-end, middleware, or front-end components. Components may be interconnected by any form or medium of digital data communication, e.g., a communication network. Examples of communication networks include a local area network (LAN) and a wide area network (WAN), e.g., the Internet.

What is claimed is:

1. A computer-implemented method, comprising:
    initiating, on a computing device, an augmented reality (AR) application targeted for testing, the AR application including at least one virtual content integrated into a real-world space;
    controlling a physical model to simulate movement of a simulated device in a simulated real-world space, the physical model interpolating physical parameters describing a current state, the simulated movement of the physical model generating data;
    forwarding the generated data to a tracking framework of the AR application;
    using the tracking framework for motion tracking and viewing movement of the at least one virtual content in the real-world space; and
    evaluating functionality of the AR application using the physical model, the generated data, the tracking framework and the motion tracking.

2. The computer-implemented method of claim 1, wherein the initiating includes:
    initiating the AR application to run on a device simulator running on the computing device.

3. The computer-implemented method of claim 2, wherein the AR application is initiated using a virtual environment.

4. The computer-implemented method of claim 2, wherein the device simulator is initiated using virtual device configuration information.

5. The computer-implemented method of claim 2, further comprising:
    introducing errors in the data being generated to simulate failure scenarios.

6. The computer-implemented method of claim 1, wherein the controlling includes:
    controlling the physical model using user controls, the user controls driving the physical model to simulate the movement of the simulated device.

7. The computer-implemented method of claim 1, wherein the data that is generated is associated with one or more of a position, a velocity, an acceleration, or a rotation of the physical model.

8. The computer-implemented method of claim 1, wherein the testing of the AR application further includes:
    initiating the AR application, using a virtual environment, to run on a device simulator.

9. A non-transitory computer-readable storage medium having stored thereon computer executable program code which, when executed on a computer system, causes the computer system to perform operations, comprising:
    initiating an augmented reality (AR) application targeted for testing, the AR application including at least one virtual content integrated into a real-world space;
    controlling a physical model to simulate movement of a simulated device in a simulated real-world space, the physical model interpolating physical parameters describing a current state, the simulated movement of the physical model generating data;
    forwarding the generated data to a tracking framework of the AR application;
    using the tracking framework for motion tracking and viewing movement of the at least one virtual content in the real-world space; and
    evaluating functionality of the AR application using the physical model, the generated data, the tracking framework and the motion tracking.

10. The computer-readable storage medium of claim 9, further comprising code for initiating the AR application to run on a device simulator.

11. The computer-readable storage medium of claim 10, wherein the AR application is initiated using a virtual environment.

12. The computer-readable storage medium of claim 10, wherein the device simulator is initiated using virtual device configuration information.

13. The computer-readable storage medium of claim 10, further comprising: introducing errors in the data being generated to simulate failure scenarios.

14. The computer-readable storage medium of claim 9, further comprising code for controlling the physical model using user controls, the user controls driving the physical model to simulate the movement of the simulated device.

15. The computer-readable storage medium of claim 9, wherein the data that is generated is associated with one or more of a position, a velocity, an acceleration, or a rotation of the physical model.

16. The computer-readable storage medium of claim 9, wherein the testing of the AR application further comprising code for: initiating the AR application, using a virtual environment, to run on a device simulator.

17. A device simulator, comprising:
a processor;
at least one memory including a physical model; simulated sensors; and user controls,
the device simulator being configured to initiate an augmented reality (AR) application targeted for testing, the AR application including at least one virtual content integrated into a real-world space,
the physical model configured to interpolate physical parameters describing a current state and to simulate movement of a simulated device in a simulated real-world space,
the simulated movement of the physical model generating data,
the simulated sensors receiving the generated data from the physical model and sharing with an AR tracking system of the AR application,
the AR tracking system being used for motion tracking and viewing movement of the at least one virtual content in the real-world space, and
the physical model, the generated data, the AR tracking system and the motion tracking being used for evaluating functionality of the AR application.

18. The device simulator of claim 17, wherein the AR application is initiated using a virtual environment.

19. The device simulator of claim 18, wherein the device simulator is initiated using virtual device configuration information.

20. The device simulator of claim 17, wherein the user controls are configured to drive the physical model to simulate the movement of the simulated device.

21. The device simulator of claim 17, wherein the data that is generated is associated with one or more of a position, a velocity, an acceleration, or a rotation of the physical model.

22. The device simulator of claim 17, wherein the device simulator is further configured to initiate the AR application using a virtual environment.

* * * * *